United States Patent
Otremba et al.

(10) Patent No.: US 9,035,437 B2
(45) Date of Patent: May 19, 2015

(54) PACKAGED DEVICE COMPRISING NON-INTEGER LEAD PITCHES AND METHOD OF MANUFACTURING THE SAME

(71) Applicant: Infineon Technologies Austria AG, Villach (AT)

(72) Inventors: Ralf Otremba, Kaufbeuren (DE); Guenther Lohmann, Ebenthal in Kaernten (AT); Josef Hoeglauer, Kirchheim-Heimstetten (DE); Teck Sim Lee, Melaka (MY); Matteo-Alessandro Kutschak, Ludmannsdorf (AT); Wolfgang Peinhopf, Viktring (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/797,763

(22) Filed: Mar. 12, 2013

(65) Prior Publication Data
US 2014/0264798 A1   Sep. 18, 2014

(51) Int. Cl.
*H01L 23/495*   (2006.01)
*H01L 23/00*    (2006.01)
*H01L 21/56*    (2006.01)

(52) U.S. Cl.
CPC .......... *H01L 23/49517* (2013.01); *H01L 24/96* (2013.01); *H01L 23/49541* (2013.01); *H01L 23/49562* (2013.01); *H01L 23/49575* (2013.01); *H01L 21/561* (2013.01); *H01L 2924/13091* (2013.01); *H01L 2924/13062* (2013.01)

(58) Field of Classification Search
CPC ............. H01L 23/3672; H01L 23/495; H01L 23/49541; H01L 23/49575; H01L 2924/381
USPC ......................................... 257/675, 676, 692
See application file for complete search history.

(56) References Cited

U.S. PATENT DOCUMENTS

| | | | |
|---|---|---|---|
| 4,575,748 A | | 3/1986 | Terui et al. |
| 5,031,024 A | * | 7/1991 | Kudo et al. .................... 257/791 |
| 5,224,021 A | * | 6/1993 | Takada et al. .................. 361/774 |
| 7,547,964 B2 | * | 6/2009 | Pavier et al. ................... 257/691 |
| 7,923,827 B2 | | 4/2011 | Heng et al. |
| 8,253,225 B2 | | 8/2012 | Otremba et al. |
| 2001/0019856 A1 | * | 9/2001 | Takahashi et al. ............ 438/127 |
| 2009/0121777 A1 | * | 5/2009 | Nakajima ...................... 327/493 |
| 2011/0116247 A1 | | 5/2011 | Kim et al. |
| 2011/0121440 A1 | * | 5/2011 | Fujiwara et al. .............. 257/675 |

OTHER PUBLICATIONS

Mixed Lead Pitch/Pad Geometry for Surface Mount Technology, IBM Technical Disclosure Bulletin, published Oct. 1, 1989.*

* cited by examiner

*Primary Examiner* — Peniel M Gumedzoe
(74) *Attorney, Agent, or Firm* — Slater & Matsil, L.L.P.

(57) ABSTRACT

Packaged chips comprising non-integer lead pitches, systems and methods for manufacturing packaged chips are disclosed. In one embodiment a packaged device includes a first chip, a package encapsulating the first chip and a plurality of leads protruding from the package, wherein the plurality of leads comprises differing non-integer multiple lead pitches.

18 Claims, 7 Drawing Sheets

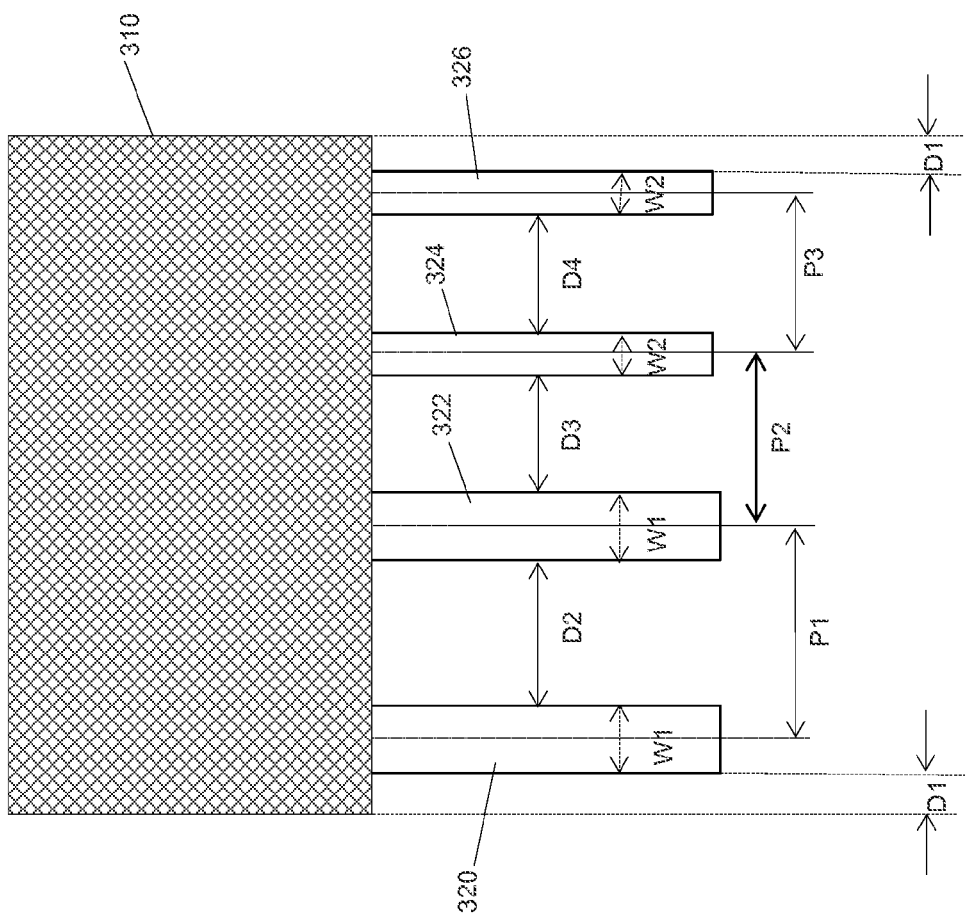

US 9,035,437 B2

PACKAGED DEVICE COMPRISING NON-INTEGER LEAD PITCHES AND METHOD OF MANUFACTURING THE SAME

TECHNICAL FIELD

The present invention relates generally to semiconductor packaging and in particular, to the configuration of package leads.

BACKGROUND

Packaging and Assembly constitute the last phase of semiconductor device fabrication. Packaging provides the necessary interconnects between a chip and a chip carrier as well as a protective enclosure against chemical, mechanical or radiation-induced damage. Continuous technology improvements are under way in order to meet the demand for devices with smaller dimensions, enhanced performance, more diverse functionality and improved reliability.

SUMMARY OF THE INVENTION

In accordance with an embodiment a packaged device comprises a first chip, a package encapsulating the first chip and a plurality of leads protruding from the package, wherein the plurality of leads comprises differing non-integer multiple lead pitches.

In accordance with an embodiment a method for manufacturing a packaged chip comprises mounting first chips onto a chip carrier assembly, wherein the chip carrier assembly comprising differing non-integer multiple lead pitches, connecting the first chips to leads of the chip carrier assembly, encapsulating the first chips with an encapsulant, and separating the first encapsulated chips into individual packaged chips.

In accordance with an embodiment system comprises a first chip, a package encapsulating the first chip, a first lead protruding from the package, a second lead protruding from the package, the first lead and the second lead arranged in a first lead pitch, a third lead protruding from the package, the second lead and the third lead arranged in a second lead pitch and a fourth lead protruding from the package, the third lead and the fourth lead arranged in a third lead pitch, wherein the first lead pitch is non-integer multiple different than the second lead pitch and the third lead pitch, and wherein the second lead pitch is non-integer multiple different than the third lead pitch.

BRIEF DESCRIPTION OF THE DRAWINGS

For a more complete understanding of the present invention, and the advantages thereof, reference is now made to the following descriptions taken in conjunction with the accompanying drawings, in which:

FIG. 3A illustrates a top view of an embodiment of a packaged chip comprising leads with various widths and various lead pitches;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 2:
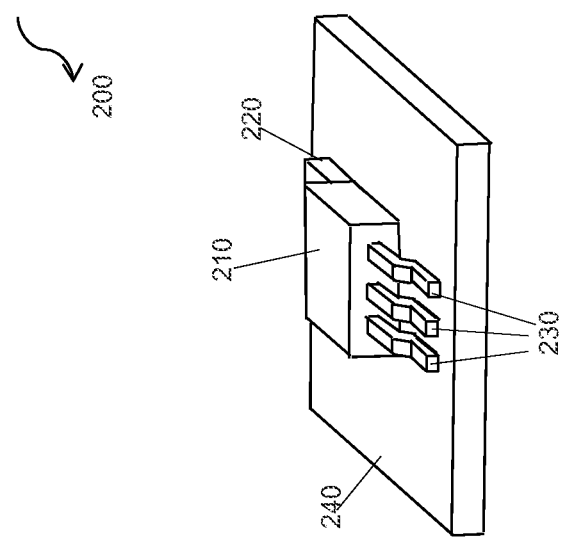
FIG. 2 illustrates a three-dimensional view of a packaged chip connected to a component carrier by surface mounting technology (SMD)

Packaging may not only provide mechanical attachment of a chip to a chip carrier but may also provide electrical connections between the chip and leads, pads or pins. The packaged chips may be categorized in a plurality of categories. For example, the packaged chip may be a through-hole package (THP) as shown in FIG. 1 or a surface mount device (SMD) as shown in FIG. 2

Figure 1:
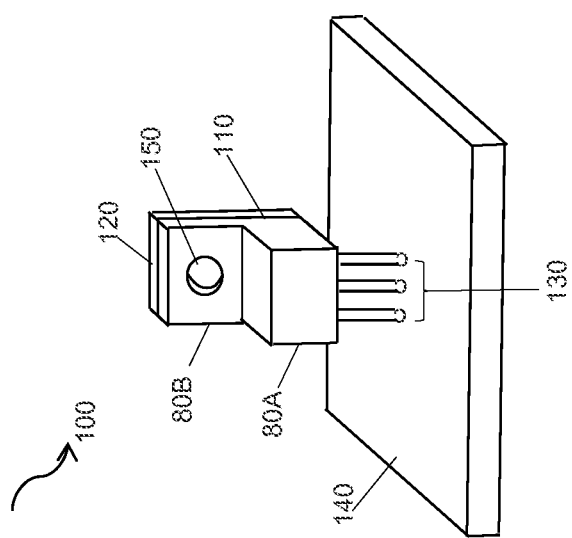
FIG. 1 illustrates a three-dimensional view of a packaged chip connected to a component carrier by through-hole interconnection technology.

The system 100 of FIG. 1 comprises a packaged chip 110, a heatsink (heatslug) 120 disposed on bottom side of the packaged chip 110 and leads or pins 130 electrically connecting the packaged chip 110 to the component carrier 140.

The packaged chip 110 may comprise a chip carrier such as a leadframe disposed within the package. The leadframe includes the plurality of leads 130. A chip is disposed on a die attach or die paddle of the leadframe.

In some embodiments the package or encapsulant comprises a first portion 80A and a second portion 80B. The first portion 80A is directly disposed over the chip. The second portion 80B may be disposed laterally adjacent the chip. The second portion 80B is opposite to the direction of the plurality of leads 130 such that the chip is disposed between the plurality of leads 130 and the second portion 80B. The first portion 80A is thicker than the second portion 80B. An opening 150 may be disposed within the encapsulant. The opening 150 is configured to enable mounting of a heatsink 120. For example, a heatsink 120 may be attached to the packaged chip 110 using a screw mounted through the opening 150 (the screw is not shown for simplicity reasons).

In various embodiments, the chip may be a power chip, which, for example, draws large currents (e.g., greater than 30 amperes). For example, the chip may be configured to operate at about 20 V to about 1000 V. Alternatively, the chip may be configured to operate at about 20 V to about 100 V. In other embodiments, the chip may be configured to operate at about 100 V to about 500 V. In one embodiment, the chip may be configured to operate at about 5 V to about 20 V.

In various embodiments, the chip may be a power semiconductor device, which may be a discrete device in one embodiment. In one embodiment, the chip is a three terminal device such as a power metal insulator semiconductor field effect transistor (MISFET), a junction field effect transistor (JFET), bipolar junction transistor (BJT), an insulated gate bipolar transistor (IGBT), or a thyristor. Alternatively, the chip comprises an integrated circuit (IC).

In one embodiment, the chip is an n-channel MISFET. In another embodiment, the chip is a p-channel MISFET. In one or more embodiments, the chip may comprise a plurality of devices such as a vertical MISFET and a diode, or alternatively two MISFET devices separated by an isolation region.

The system 200 of FIG. 2 represents an example of a SMD attached to a component carrier 240. The assembly 200 comprises a packaged chip 210 attached along one of its major surfaces to a component carrier 240. Mechanically attached to one side of the packaged chip 210 and in direct mechanical contact to the component carrier 240 may be a heat sink 220. Electrical connectivity to internal functional elements of the packaged chip 210 is achieved via a set of leads 230 connecting contacts pads at the package periphery and contact pads at the component carrier. These leads may be J-shaped or gull wing shaped, for example. Alternatively Surface Mount Technology (SMT) may be also exercised by utilizing solderjoints on ball grid arrays positioned at the bottom side of the package 210 facing the carrier 240.

The chip may be the same chip as described with respect to FIG. 1 and the operation currents and potentials may be the same as described with respect to FIG. 1.

Surface Mount Technology has widely replaced Through-Hole Technology (THT) due to its advantage with respect to packing density, providing a significant economic advantage. Through-Hole Technology, on the other hand, still furnishes superior interconnect reliability, and is thus still favored for certain (e.g. military) applications. THT-based assemblies provide furthermore an additional advantage with respect to the efficiency of dissipation of heat from the interior of a device to the outside. For SMDs thermal transport has to occur via a component carrier 240 to which a heatsink 220 is attached.

Various embodiments of the invention provide flexible lead design for a packaged chip. For example, each lead may be optimized for its intended purposes independently of standard printed circuit board configurations. Various embodiments of the invention provide a lead configuration which is not defined by a standard printed circuit board. For example, the leads may be optimized on the basis of current densities, creepage distances (e.g., isolation distances between two potentials), capacities and inductivities. In various embodiments this results in leads have differing widths, pitches and/or length. For example, leads may have differing non-integer multiple lead pitches (including multiples of 1).

For a packaged chip attached to a carrier via THT the creepage distance between two leads at the surface of the component carrier (e.g. a PCB) may be a critical parameter. The clearance distance, e.g., the distance between adjacent leads in air, may be less critical because air provides adequate insulation for about 1 kV voltage/mm of distance. Over time moisture and other conductive contaminants from the ambient may accumulate on the surface of the component carrier and eventually create an unacceptably high leakage current between adjacent leads. This problem may become more crucial if higher operation voltages are applied.

Various embodiments of the present invention provide improvements in electrical performance for packaged chips subjected to high-voltage and/or high-current operation.

FIG. 3A shows an embodiment of a packaged chip 300. The packaged chip 300 comprises a chip (or a plurality of chips) disposed on a chip carrier within the package (or encapsulation) 310. The packaged chip 300 comprises four leads 320, 322, 324, 326 protruding in parallel from the package 310.

In various embodiments the packaged chip 300 may comprises a chip, current and/or voltage applications as described with respect to FIGS. 1 and 2. The chip may comprise a vertical structure, with a drain electrode disposed on a first main surface of the chip and the source and gate electrodes disposed on the second main surface of the chip. Alternatively, the drain and the gate electrodes are disposed on a first main surface of the chip and the drain electrode is disposed on the other major surface of the chip. The packaged chip 300 may furthermore comprise a control chip, a sensor chip, a logic chip or a chip of other nature (e.g., a MEMS device). In some embodiments, the further chip(s) may be disposed on the power chip. In other embodiments the further chip(s) may be disposed adjacent to a side surface of the power chip. In yet other embodiments the power chip may be a regular discrete chip or an integrated circuit.

The semiconductor chip enclosed in the packaged chip 300 may be manufactured from a semiconductor material or a compound semiconductor material such as Si, SiGe, SiC, or GaAs. The semiconductor chip may further comprise inorganic and organic materials such as silicon oxide, silicon nitride, insulating plastics or metals. The package or encapsulant 310 may comprise a molding compound such as thermosetting or thermoplastic materials, or a laminate.

The leads 320-326 may be part of a metallic leadframe comprised of materials such as copper, copper alloy, aluminum, aluminum alloy, or brass. Alternatively the leads 320-326 may comprise a conductive material such as wires or prefabricated metal parts solder-attached to contact pads at the periphery of the package 310.

In some embodiments the packaged chip 300 may include leads comprising differing non-integer lead pitches (including non-integer multiple lead pitches). The first pitch P1, the distance between the centers of the leads 320 and 322, is larger than the second pitch P2 and the third pitch P3 is larger than the second pitch P2 but P1 is not equal P3. In a particular example, the first pitch P1 is 3.54 mm, the second pitch P2 is 1.94 mm, and the third pitch, P3 is 2.14 mm. Pitch P1 and pitch P3 are non-integer multiple of pitch P2 and vice versa.

In alternative embodiments leads 320-324 (322-326) may comprise multiple integer pitches and the leads 324-326 (320-322) comprise a non-integer multiple pitch. Alternatively, leads 320-322 and 324-326 comprise integer pitches and leads 322-324 comprise a non-integer multiple pitch.

The variability in lead pitch for the packaged chip 300 may provide wider lead pitches where it is deemed necessary to avoid creepage current issues. For low-voltage leads, the lead pitch may be kept significantly smaller to minimize the impact on the foot print consumed at the surface of a component carrier onto which the packaged chip 300 is configured to be mounted.

In various embodiments the packaged chip 300 may further comprise leads 320-326 with various lead (or non-uniform) thicknesses. The leads 320 and 322 comprise a first width (first diameter) $W_1$ and the leads 324 and 326 comprise a second width (second diameter) $W_2$. The first width $W_1$ may be larger than the second width $W_2$. For example, the first width $W_1$ may be between 0.5 mm and 5 mm or between 0.5 and 1.5 mm. Alternatively, the first width $W_1$ may be about 1 mm. The second width $W_2$ may be between 0.25 mm and 2.5 mm or between 0.25 and 0.75 mm. Alternatively, the second width $W_2$ may be about 0.5 mm.

The leads 320 and 322 may be used for high voltage/high current applications and the leads 324 and 326 may be used for low voltage or logic applications. The leads 320 and 322 may be electrically connected the load electrodes of a power chip and thus be part of the load path of a power chip subjected to high voltages and/or high currents. The leads 324 and 326 may be electrically connected to a sensor chip or logic chip controlling the power chip.

High current flows, 10 A-100 A, may require cross-sections around 1 mm² or diameters in the range of 0.5 mm-1 mm. Lead cross-sections of 0.2 mm²-0.3 mm² may be sufficient for conductive paths used for signal transfer or for connectivity to logic chips with currents remaining in the 1 A-10 A range.

In alternative embodiments, the width of the first lead 320 is different than the width of the second lead 322 and the width of the third lead 324 is different than width of the fourth lead 326. Alternatively, the width of each lead is different than the width of each of the other leads. The variability in the lead pitches as well as lead widths may allow optimization for varying current flows and voltage potentials.

In yet another embodiment of the present invention a packaged chip comprises multiple lead pitches and constant lead to lead distances. This combination may only be possible if the lead-width is non-uniform. This specific lead design provides lead pitch and width variability to accommodate the needs of high power/current device.

In a further embodiment packaged chip 300 comprises different lead pitches and different lead to lead distances for all leads.

A yet other embodiments the packaged chip 300 may comprise various lead lengths to enable proper connections to conductive portions in different layers of a component carrier such a printed circuit board (PCB).

Figure 3B:
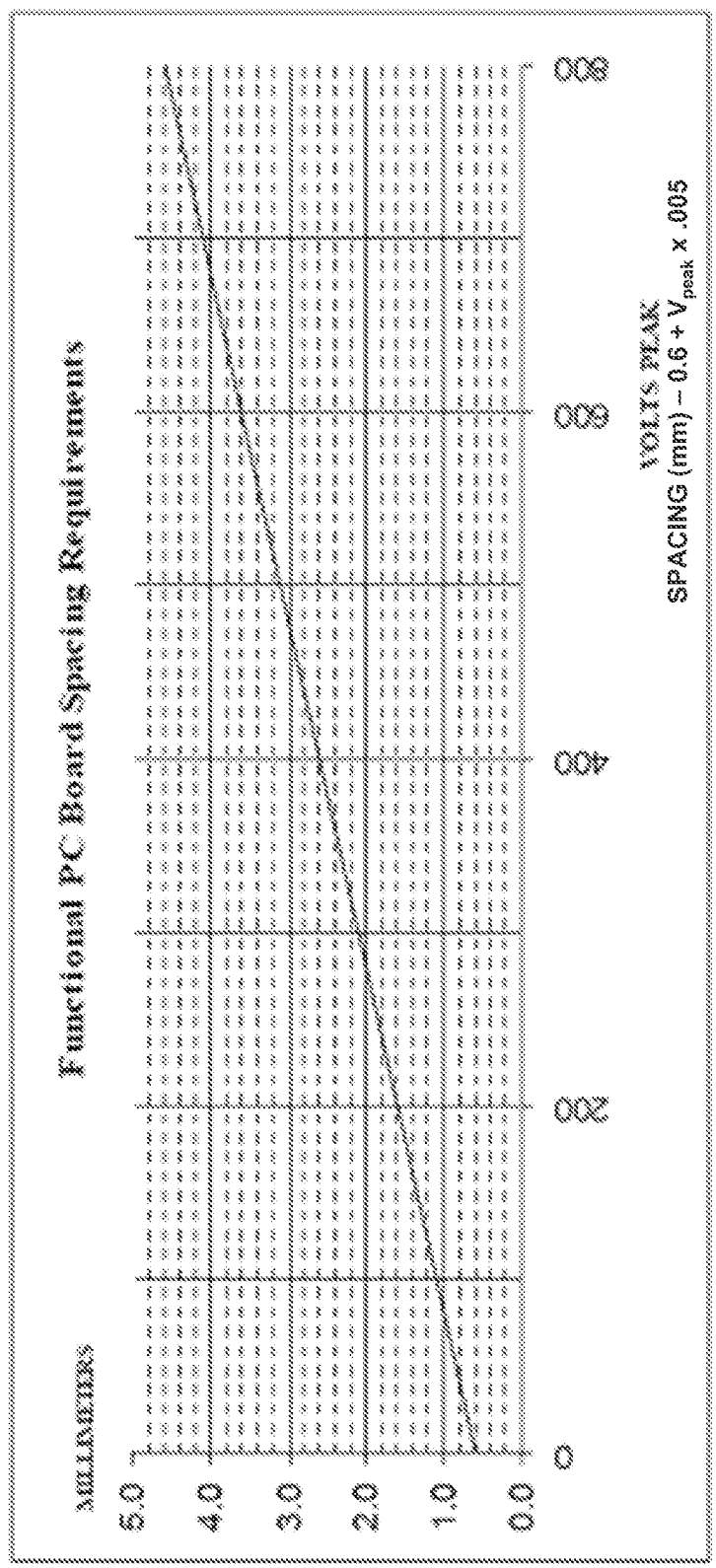
FIG. 3B illustrates voltage spacing requirements for PC board conductors.

FIG. 3B shows a graph of an isolation (e.g., creepage) distance (edge to edge of the leads such as D2, D3 and/or D4, not the pitch) in between leads for power conversion devices. The y-axis refers to the isolation distance between the leads and x-axis refers to the voltage peak of the devices. For example, as can be seen from FIG. 3B the distance of the lead for a voltage peak of 100 kV is 1.1 mm and the distance of the leads for a voltage peak of 200 kV is 1.6 mm.

Figure 3C:
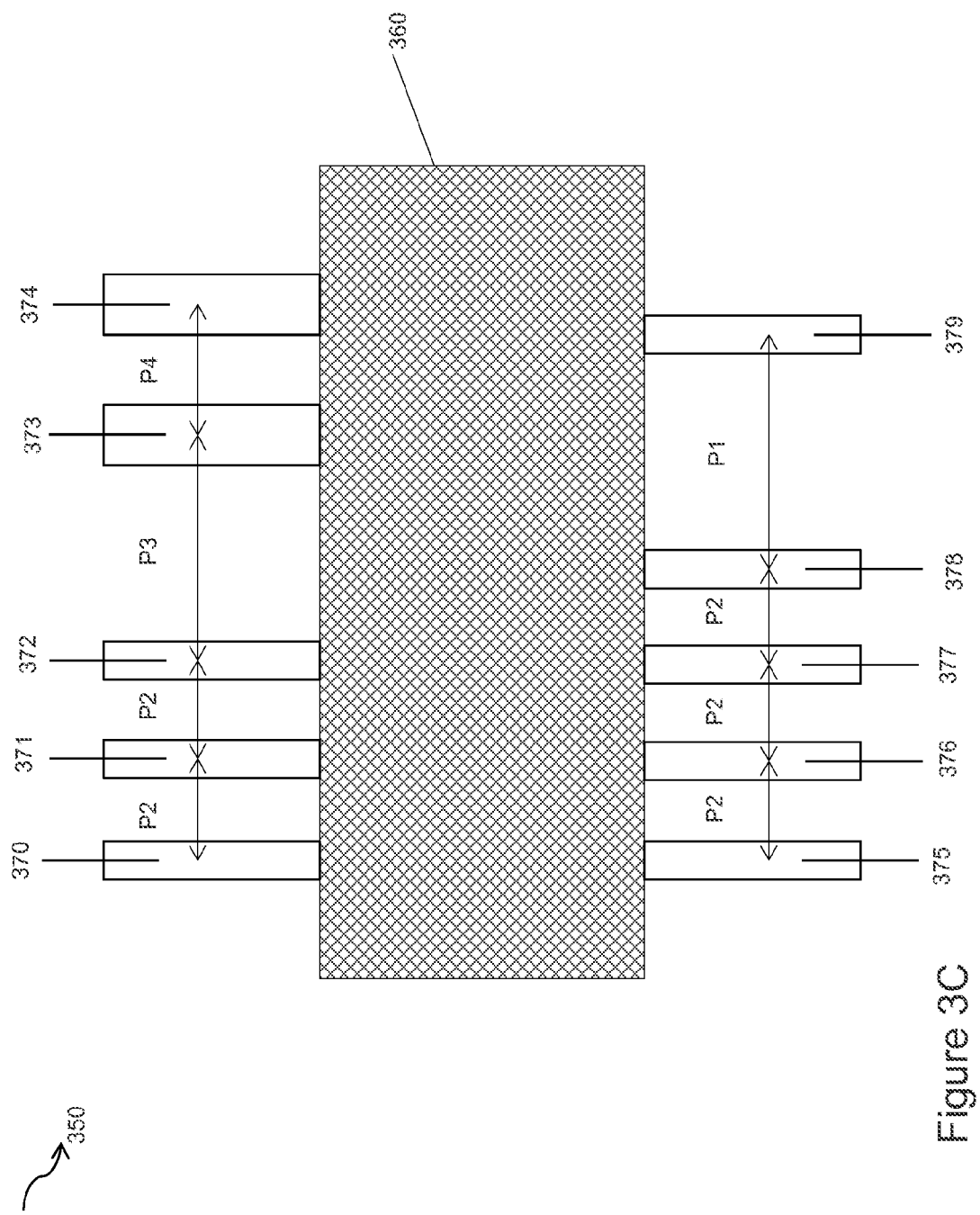
FIG. 3C illustrates a top view of another embodiment of a packaged chip comprising leads with various widths and various lead pitches.

FIG. 3C shows another embodiment of a packaged chip 350. The packaged chip 350 comprises a chip (or a plurality of chips) disposed on a chip carrier within the package (or encapsulation) 360. The packaged chip 300 comprises ten leads (five on a first side and five on a second side of the package 360) 370-379 protruding in parallel from the package 360. The leads have differing non-integer multiple pitches on the first side, differing non-integer multiple pitches on the second side, and differing non-integer multiple pitches on both sides. P1 is non-integer multiple different than P2, P1 and P2 are non-integer multiple different than P3 and P1, P2, P3 are non-integer multiple different than P4. In some embodiments, the packaged chip 350 may have the same lead pitches (or integer multiples thereof) for all leads but for one lead pitch. The one lead pitch is a non-integer multiple lead pitch.

In alternative embodiments non-integer multiple lead pitches may be disposed on all four sides of the packaged chip 350.

Figure 3D:
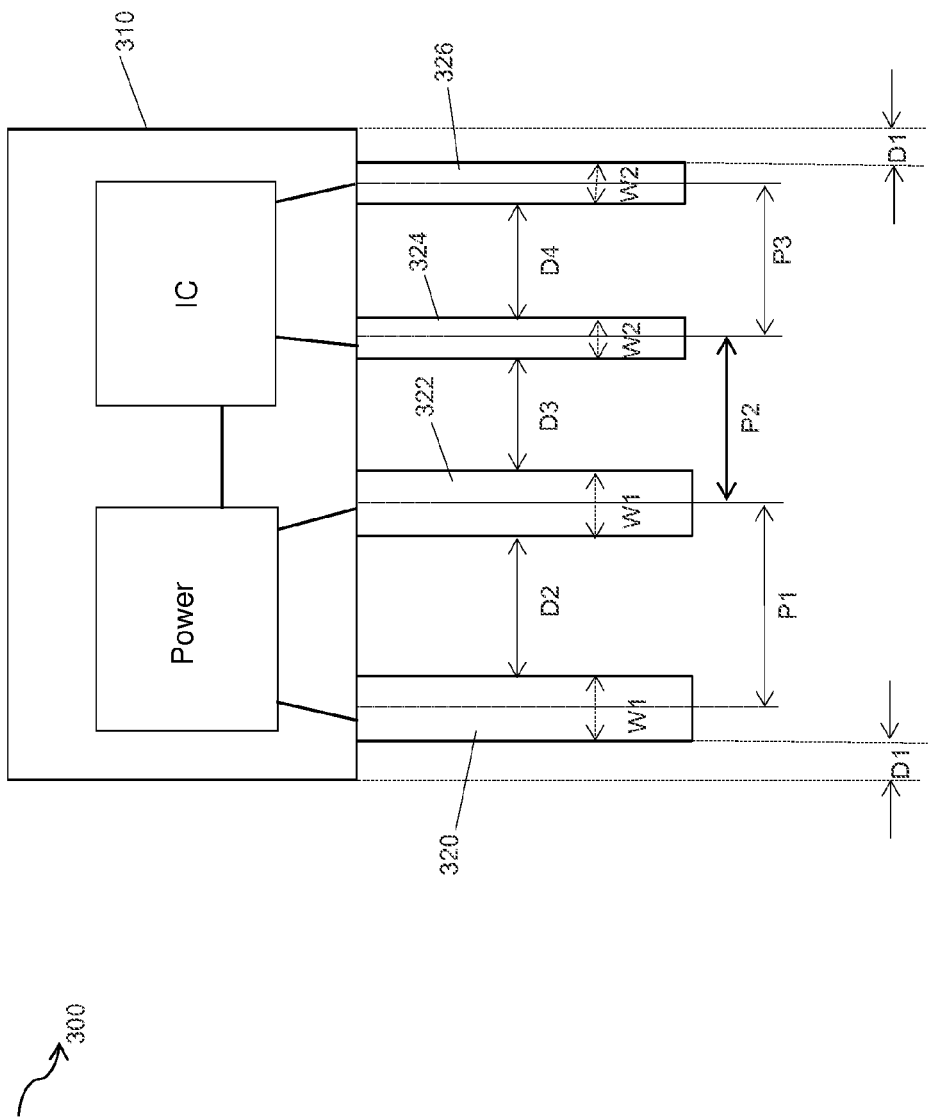
FIG. 3D illustrates a top view of an embodiment of packaged chips connected to leads with various pitches based on FIG. 3A.

FIG. 3D shows another embodiment of a packaged chip 310. The embodiment comprises a first chip and a second chip. The power chip and the second chip is an integrated circuit (IC). A package 310 encapsulates the first chip and the second chip. First to fourth leads protrude from the package 310. The first lead and the second lead are arranged in a first lead pitch P1, the second lead and the third lead are arranged in a second lead pitch P2 and the third lead and the fourth lead arranged in a third lead pitch P3. The first lead pitch is not an integer multiple of the second lead pitch and the third lead pitch, and the second lead pitch is not an integer multiple of the third lead pitch.

FIG. 3D further shows that a first electrode of the power chip is connected to the first lead, that a second electrode of the power chip is connected to the second lead, that a third electrode of the power chip is connected to a first terminal of the IC chip, that the first terminal of the IC chip is connected to the third lead and that a second terminal of the second chip is connected to the fourth lead.

Figure 4:
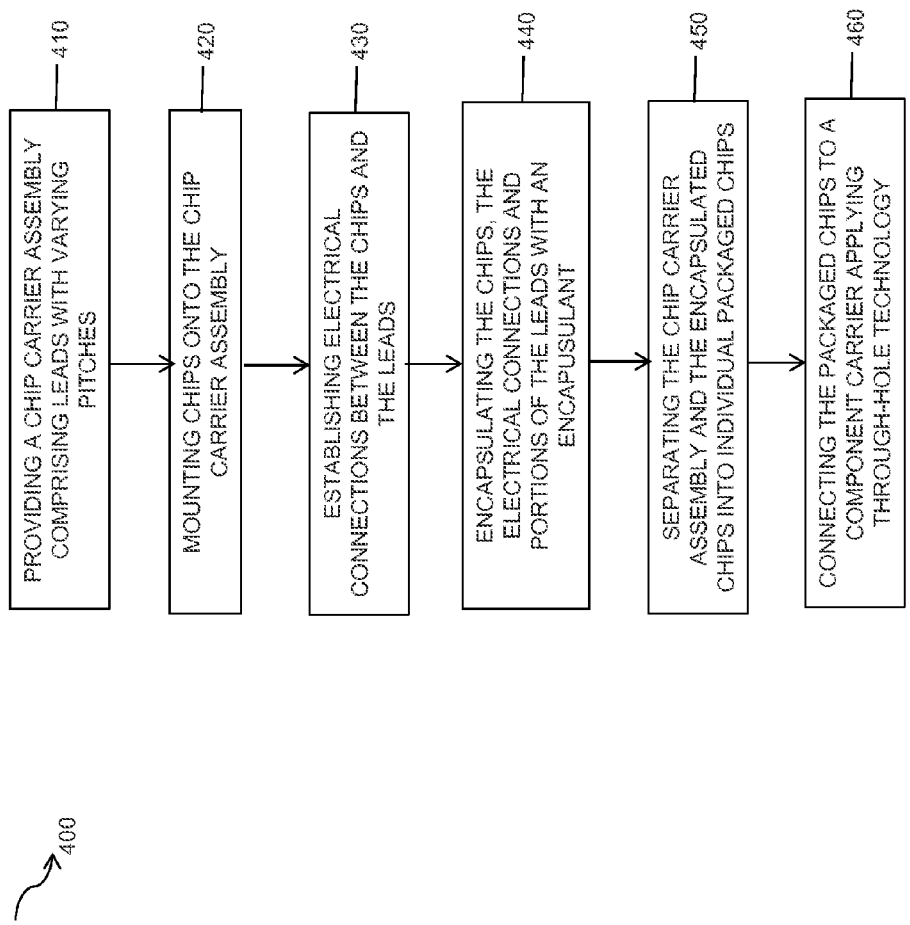
FIG. 4 illustrates a flowchart of a method for manufacturing a packaged chip according to an embodiment of the invention.

FIG. 4 shows a flowchart 400 of a method for manufacturing a packaged chip according to an embodiment of the invention. The packaged chip may be mounted on a component carrier such as a PCB board.

In a first step 410 a chip carrier assembly is provided which comprises a plurality of leadframe units, each of the leadframe units corresponding to a packaged chip. In high-volume package manufacturing, rather than processing devices individually, a plurality of chips is attached to a chip carrier assembly (e.g. a leadframe assembly). The chip carrier assembly is subjected to further processing steps and eventually separated into individual packaged chips.

Figure 5:
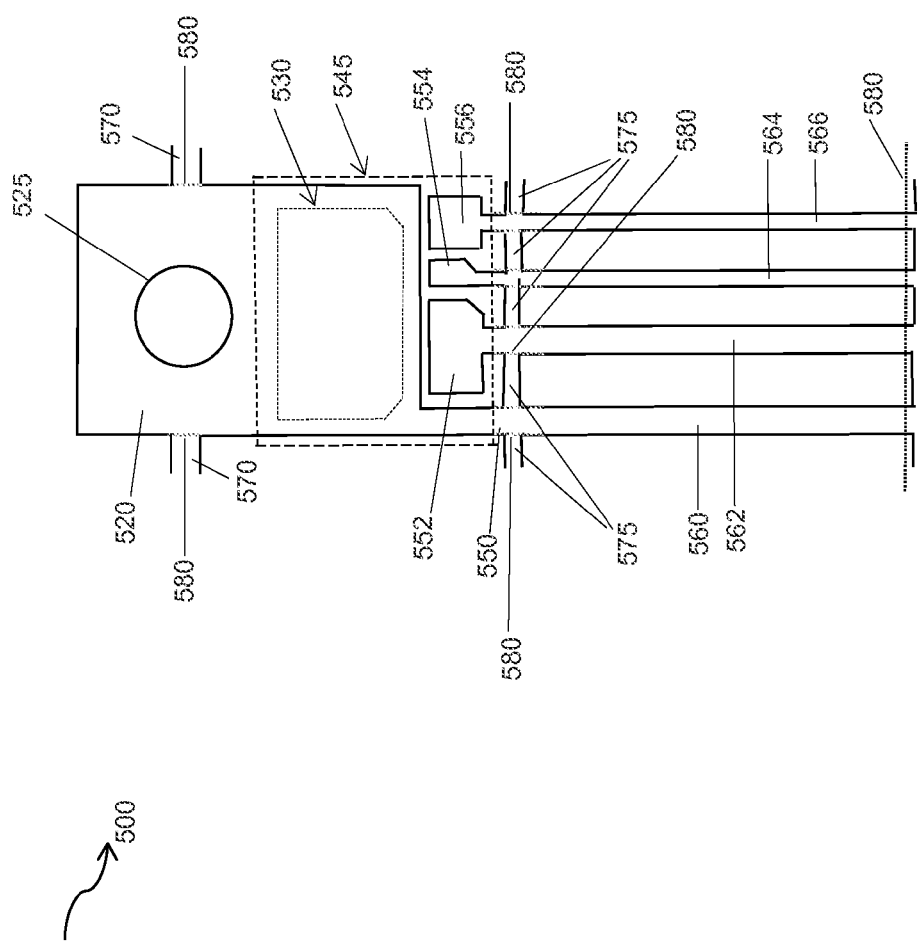
FIG. 5 illustrates a top view of a portion of a chip carrier assembly according to an embodiment of the invention, the portion being related to a single multi-pitch chip package.

For example, the leadframe assembly may comprise 8 or 16 leadframe units. An exemplary leadframe unit 500 is shown in FIG. 5. The leadframe assembly based on a multiple-pitch lead design according to previously described embodiments of the invention may be manufactured by punching a metal plate comprising conducting metallic materials as described with respect to earlier embodiments.

The leadframe unit 500 comprises a "die paddle" region 530 (chip attach region) reserved for the attachment of one or more chips. A heatsink 520 may be disposed adjacent to the die paddle 530. The heatsink 520 may comprise a hole 525 in the center of the heatsink 520 in order to easily attach an external heatsink (not depicted) to the finalized packaged chip.

The leadframe unit 500 further comprises leads. Lead portions 550, 552, 554, 561 may be enclosed with packaging material such as a molding material, while portions 560, 562, 564, 566 may not be enclosed with packaging material and protrude from the packaged chip. The package or encapsulation 545 is shown as borderline in FIG. 5. The leadframe portions 550/560, 552/562 and 556/566 may be connected to the collector/drain, emitter/source and gate electrodes of a power chip, e.g., MOSFET power chip, respectively, while parts 554/564 may provide connectivity to a sensor or logic chip disposed on the MOSFET power chip, for example.

At this stage in manufacturing the individual leadframe units (e.g. 500) as well as the paddle 530 and internal 550-556 and external 560-566 lead portions of each leadframe unit (e.g. 500) are still held together by auxiliary leadframe portions, termed tie bars or dams 570, 575. These auxiliary elements provide mechanical stability during processing until finally separation of the leadframe units.

In step 420 one or more chips are mounted on the die paddle 530 of the leadframe unit 500. The chip(s) are attached to the leadframe structure by employing solder techniques or by employing electrically conductive or non-conductive paste/foil.

Selective solder deposition may be carried out by using techniques such as rim shielding, spray/sprinkle, or stencil printing. Formation of solder joints may occur at a temperature in the range of 200° C.-400° C., generally 20° C.-50° C. above the melting point of the solder material. The applied solder layer may have a thickness of 100 nm to 1 μm, but lower or higher thickness values are also feasible. Diffusion solder or soft solder materials may be employed. Diffusion solder materials such as AuSn, CuSn, AgSn, AuSi, AuIn, CuIn or AgIn diffuse into the counter-faces of the materials to be bonded and form intermetallic phases at the interface. Soft solder materials, generally SnPb alloys of varying compositions, remain at the bonding interface after completion of the soft soldering process.

A pick-and-place tool may be used to pick up the chips to be mounted, to align them accurately over their assigned positions and then to press them onto the preheated leadframe units 500 in order to initiate the formation of solder bonds. For example, a 75% Au25% Sn solder may comprise a solder thickness of 1200 nm, at a temperature of 360° C., and bond force 3.3 N/mm$^2$, in reducing gas atmosphere (a few % $H_2$ in $N_2$).

In an alternative embodiment the attachment of chips to the leadframe may be achieved by application of conductive or non-conductive, organic or nom-organic adhesive layers, deposited as paste or foil. Organic adhesive layers may comprise epoxy, acrylate, cyanate ester or polyimide compounds mixed with a crosslinking component. Electrically conductive adhesives materials may in addition comprise nano-particles (up to 70 volume %-85 volume %) of Au, Ag, Cu, or Ag-plated or Au-plated Ni. Attachment processes employing adhesive materials are generally carried out at temperatures between 120° C.-200° C., frequently combined with application of pressure (1 PSI-5 PSI). After completion of the attachment process the adhesive layer is dried and cured in an oven or by flow of hot air.

When applying a solder material or a conductive paste/foil, mechanical as well as electrical connectivity between the chip and the leadframe is generated. For example, a first main surface of a power MOSFET chip comprising a collector/drain electrode is attached to the paddle 530 of the leadframe unit 500. The paddle 530 is connected to a first lead 560.

In step 430 leads of the leadframe are connected to the power MOSFET chip and/or to a logic chip/sensor chip. For example, the source electrode disposed on an upper main surface of a power MOSFET chip is connected to a second lead and the gate electrode also disposed on the upper main surface of the power MOSFET chip is connected to the logic chip. The logic chip may be connected to the third lead and to a fourth lead. Alternatively, the source electrode is connected to the second lead and the gate electrode is connected to another lead. The logic chip in turn is connected to the fourth and fifth lead. The connection may take place via wire bonding, ball bonding or clip bonding. The materials of the wires or clips may be Au, Al, Ag or Cu. The thickness of the wire bonds may vary between 16 and 500 μm.

Three different techniques may be available for wire bonding: ultrasonic, thermo-compression and thermosonic bonding. Ultrasonic bonding may employ ultrasonic energy (20 kHz to 60 kHz) at room temperature, with bonding times around 20 ms. Thermo-compression may utilize a combination of pressure and heat (with temperatures in the range of 300° C.-500° C.). Thermosonic bonding is based on the combined effects of ultrasonic energy, heat (with temperatures of 125° C.-150° C.) as well as pressure. The pressure applied in thermosonic bonding may be about an order of magnitude lower than that needed for thermo-compression bonding.

In the next step 440 the chips, bond (e.g. wire bonds) and portions of the leads 550, 552, 554, 556 are encapsulated with an encapsulant such as molding compound. The molding compound may be a thermosetting material or thermoplastic material. Several molding techniques may be applied such as transfer and injection molding. With transfer molding thermosetting molding material is transferred under pressure into a molding chamber to fill the cavities of the mold. A post-cure step may follow. With injection molding plastic pellets are transported through several heating zones. At the last and hottest heating zone the molding material reaches a molten state. From there the molding material is injected into the molding chamber where solidification occurs. Irrespective of the molding method applied, the resulting packages are subsequently subjected to a de-flash step in order to remove excessive resin. De-flashing is carried out employing mixtures of abrasive particles in combination with high pressure air or a high pressure water slurry.

In step 450 the encapsulated chip assembly is separated into individual chip packages by cutting through tie bars/dams 570/575 and the encapsulant along pre-determined cut lines 580 (as indicated in FIG. 5).

Finally, in step 460, one of the chip package comprising multi-pitch leads (e.g., non-integer pitch leads) is interconnected to a component carrier by application of Trough-Hole Technology or a Surface Mount Technology. The component carrier may be a printed circuit board or a prepreg laminate. Alternatively, the component carrier may be a substrate comprising a body of an electrically isolating material (e.g. ceramic, glass, polymers), which comprises electrically conducting traces (e.g., copper or aluminium).

The chip package is connected to the component carrier by inserting package leads 560, 562, 564, 566 into corresponding holes of the component carrier. The leads may comprise a thin coating of Sn, Sn alloys or Au to facilitate formation of high-quality solder joints. The holes in the component carrier may also be coated with similar materials and/or an organic compound to improve solder wettability. Alternatively, the leads of the chip package are disposed on component carrier contact pads.

The leads are soldered to the component carrier. The chip package and component carrier may be sprayed with a foam flux to clean the surfaces of leads and carrier holes/component carrier contact pad. The assembly then passes a turbulent and laminar flow of solder. The turbulent flow facilitates penetration of solder into narrow crevices. The laminar flow provides uniform solder distribution and facilitates flux outgassing. The applied temperature and the dwell time depend on the geometries of the assembly and on the solder material used. For SnPb solders the soldering temperature is generally in the range of 230° C.-260° C. After solder joint formation the assembly passes a hot-air knife to blow off excessive solder. An optional solvent or aqueous cleaning step may follow prior to the cool-down of the assembly.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A packaged device comprising:
   a first chip;
   a package encapsulating the first chip; and a plurality of leads protruding from the package, wherein a first distance between a first lead and a second lead is a first lead pitch, wherein the first lead pitch is a smallest lead pitch, wherein a second distance between a third lead and a fourth lead is a second lead pitch, and wherein the second lead pitch is not an integer multiple of the first lead pitch.

2. The packaged device according to claim 1, wherein the plurality of leads comprises differing lead widths.

3. The packaged device according to claim 1, wherein the plurality of leads comprises differing lead lengths.

4. The packaged device according to claim 1, wherein the plurality of leads comprises differing lead widths and differing lead lengths.

5. The packaged device according to claim 1, wherein the second lead is the same as the third lead.

6. The packaged device according to claim 1, further comprising a chip carrier, wherein the chip is disposed on a first side of the chip carrier.

7. The packaged device according to claim 6, further comprising a heat sink disposed on a second side of the chip carrier.

8. The packaged device according to claim 1, further comprising a second chip, the second chip encapsulated by the package.

9. A system comprising:
a first chip;
a second chip;
a package encapsulating the first chip and the second chip;
a first lead protruding from the package;
a second lead protruding from the package, the first lead and the second lead arranged in a first lead pitch;
a third lead protruding from the package, the second lead and the third lead arranged in a second lead pitch; and
a fourth lead protruding from the package, the third lead and the fourth lead arranged in a third lead pitch, wherein the first lead pitch is not an integer multiple of the second lead pitch and the third lead pitch, wherein the second lead pitch is not an integer multiple of the third lead pitch, wherein the first chip is a power chip, wherein the second chip is a logic chip, wherein a first electrode of the first chip is connected to the first lead, wherein a second electrode of the first chip is connected to the second lead, wherein a third electrode of the first chip is connected to a first terminal of the second chip, wherein the first terminal of the second chip is connected to the third lead, and wherein a second terminal of the second chip is connected to the fourth lead.

10. The system according to claim 9, further comprising a chip carrier and a heat sink, the first chip disposed on a first side of the chip carrier and the heat sink disposed on a second side of the chip carrier.

11. The system according to claim 9, further comprising a component carrier, wherein the first to fourth leads are connected to the component carrier.

12. A packaged device comprising:
a chip;
a package encapsulating the chip;
at least one first lead protruding from the package on a first side, wherein a first lead and a further lead of the at least one first lead are spaced away from each other by a first lead pitch, wherein the first lead pitch is a smallest pitch;
at least one second lead protruding from the package on the first side, wherein the first lead of the at least one first lead is spaced away from a neighboring second lead of the at least one second lead in a second lead pitch;
at least one third lead protruding from the package on a second side; and
at least one fourth lead protruding from the package on the second side, wherein a third lead of the at least one third lead is spaced away from a neighboring fourth lead of the at least one fourth lead in a third lead pitch, and
wherein the second lead pitch or the third lead pitch is not an integer multiple of the first lead pitch.

13. The packaged device according to claim 12, wherein the at least one second lead comprises different lead widths than the second leads.

14. The packaged device according to claim 12, wherein two adjacent second leads of the at least one second lead are spaced apart by a fourth lead pitch, wherein the fourth lead pitch is not an integer multiple of the first lead pitch.

15. The packaged device according to claim 12, wherein two adjacent third leads of the at least one third lead are spaced apart by a fifth lead pitch, wherein the fifth lead pitch is not an integer multiple of the first lead pitch.

16. The packaged device according to claim 12, wherein two adjacent third leads of the at least one third lead are spaced apart by a fifth lead pitch, wherein the fifth lead pitch is the same as the first lead pitch.

17. The packaged device according to claim 12, further comprising a second chip, the second chip encapsulated by the package.

18. A system comprising:
a first chip;
a package encapsulating the first chip;
a first lead protruding from the package;
a second lead protruding from the package, the first lead and the second lead arranged in a first lead pitch, the first lead pitch being a smallest lead pitch;
a third lead protruding from the package, the second lead and the third lead arranged in a second lead pitch; and
a fourth lead protruding from the package, the third lead and the fourth lead arranged in a third lead pitch, wherein the second lead pitch is not an integer multiple of the first lead pitch, and wherein the third lead pitch is not an integer multiple of the first lead pitch.

* * * * *